United States Patent [19]

Hasircoglu

[11] 4,050,755
[45] Sept. 27, 1977

[54] ELECTRICAL CONNECTOR

[75] Inventor: Alexander William Hasircoglu, Lancaster, Pa.

[73] Assignee: E. I. Du Pont de Nemours and Company, Wilmington, Del.

[21] Appl. No.: 672,885

[22] Filed: Apr. 2, 1976

[51] Int. Cl.² ............................................. H05K 1/12
[52] U.S. Cl. ............................. 339/17 CF; 339/17 M
[58] Field of Search .............. 339/17 R, 17 M, 17 CF, 339/17 LM, 176 MP; 317/101 CC

[56] References Cited

U.S. PATENT DOCUMENTS

| 3,016,508 | 1/1962 | Lalonde | 339/176 MP |
| 3,173,732 | 3/1965 | James | 339/176 MP |
| 3,215,968 | 11/1965 | Herrmann | 339/17 LM |
| 3,551,750 | 12/1970 | Sterling | 339/17 LM |
| 3,584,189 | 6/1971 | Marcoux | 317/101 CC |
| 3,873,173 | 3/1975 | Anhalt | 339/17 CF |
| 3,951,491 | 4/1976 | Mysiak | 339/17 CF |

FOREIGN PATENT DOCUMENTS

| 1,001,306 | 8/1965 | United Kingdom | 339/176 MP |
| 1,157,095 | 7/1969 | United Kingdom | 339/176 MP |

OTHER PUBLICATIONS

IBM Tech. Disc. Bulletin, H. C. Schick, vol. 6, No. 10, pp. 5, 6, Mar. 1964.

Primary Examiner—Roy Lake
Assistant Examiner—Neil Abrams

[57] ABSTRACT

A connector with spring contacts extending through openings in opposed surfaces of a dielectric housing. The contacts are positioned to engage conductive pads on leadless circuit elements and to establish wiped connections when the elements are located on the opposed surfaces of the housing.

8 Claims, 6 Drawing Figures

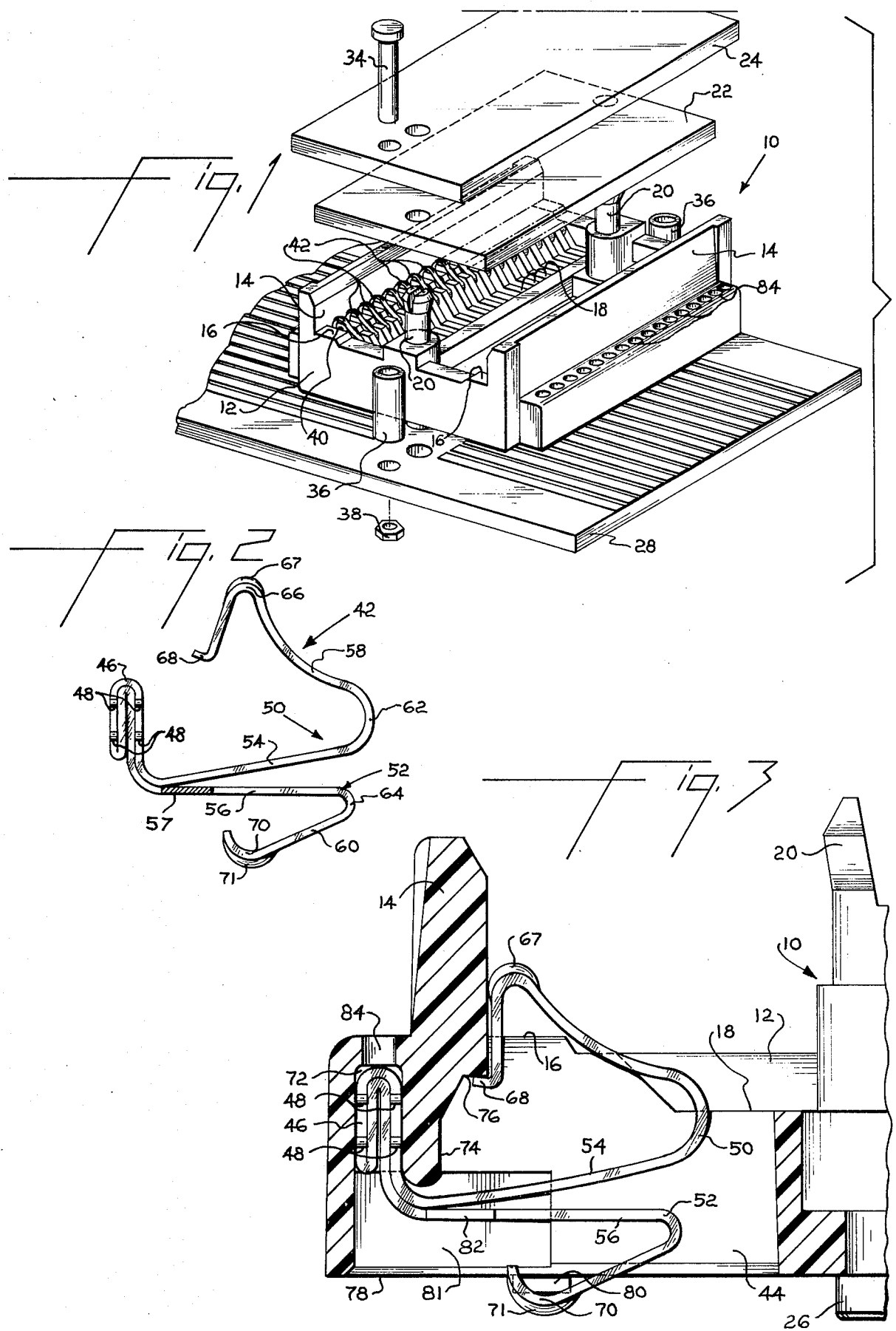

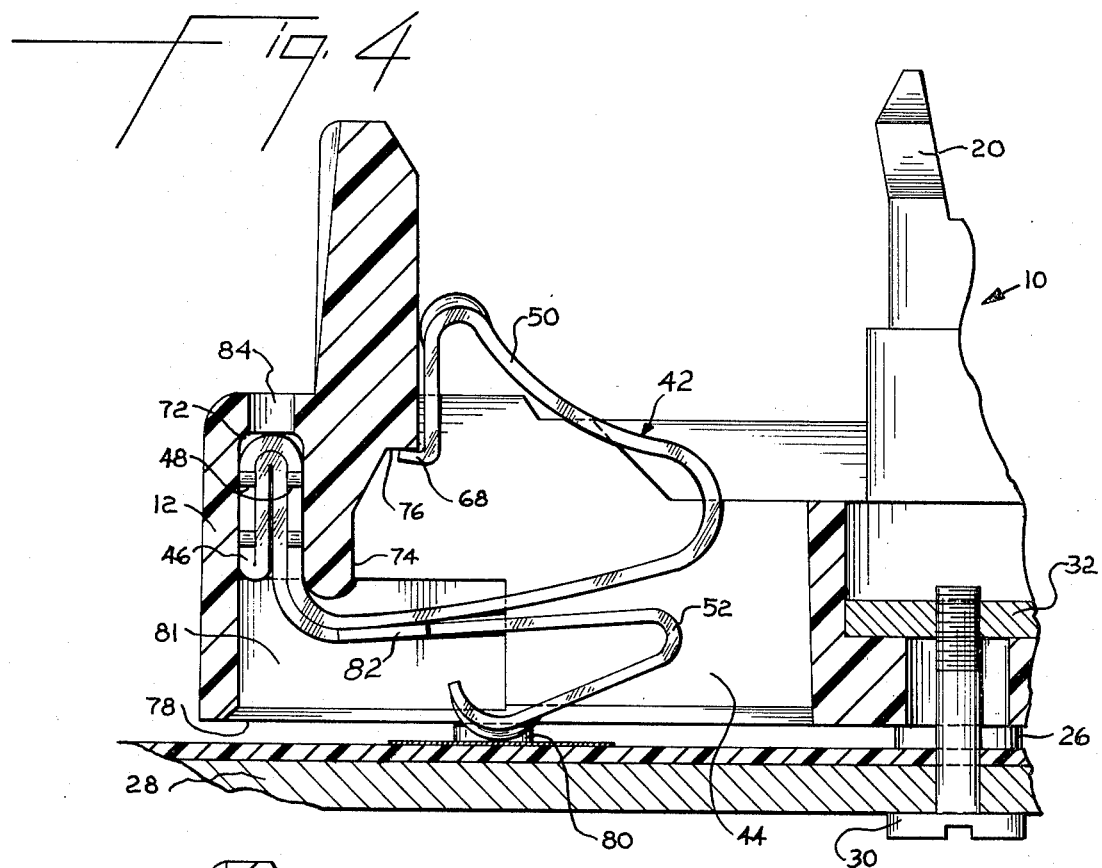
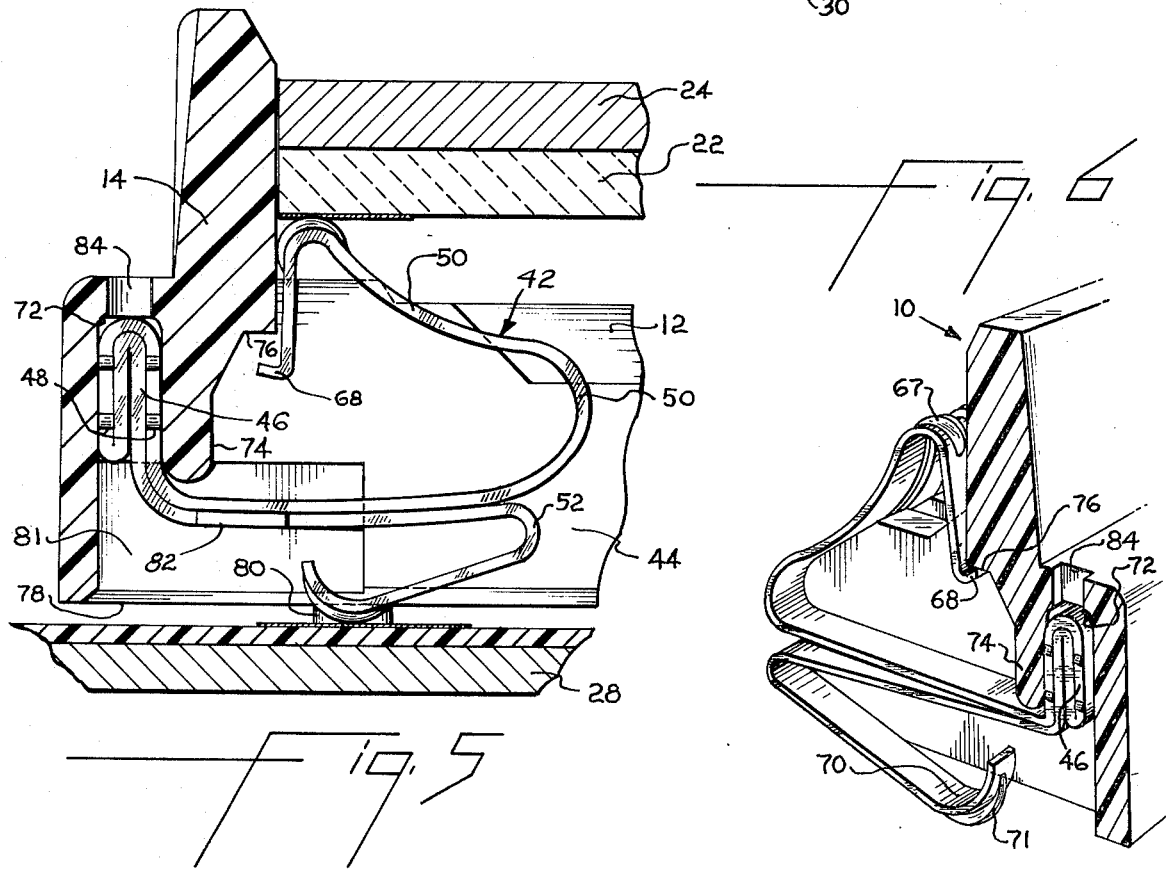

ELECTRICAL CONNECTOR

BACKGROUND

This invention relates generally to the electrical connection of a leadless package to another circuit element and, more particularly, to the contacts that are located in a dielectric housing adapted to mate with a leadless package and a circuit element such as a printed circuit board.

A connector that is first mounted on a printed circuit board and then receives a ceramic substrate carrying a leadless integrated circuit package is disclosed in U.S. Pat. No. 3,873,173 to Anhalt. When the housing is mounted on the board, a wiped connection is made between S-shaped contacts and pads on the board. When the substrate is mounted, pads thereon are wiped but, at this time, there is no assurance that clean connections still exist between the contacts and pads on the board.

SUMMARY

The electrical connector disclosed and claimed herein includes a dielectric housing with opposed surfaces adapted to mate with circuit elements provided with contact pads. The housing has opposed rows of contact-receiving cavities, each of which has openings in both surfaces and a pocket offset from the openings. In each cavity, there is a contact formed from a strip of conductive spring metal. Intermediate its ends, the strip is doubly folded into a mounting portion. From the mounting portion, the strip extends in lengths bent into opposed, unbalanced, compound, cantilever springs. When the mounting portion is frictionally fitted in the pocket, each spring has an arcuate segment projecting into an opening.

DESCRIPTION OF THE DRAWINGS

Worthwhile objectives and advantages of the connector will be apparent from the following specification wherein reference is made to the accompanying drawings in which:

FIG. 1 is an enlarged, exploded, perspective view of the connector;

FIG. 2 is a greatly enlarged, side view of a contact;

FIGS. 3-5 are fragmentary, sectional views through a contact-receiving cavity, showing the contact in its three states of compression; and FIG. 6 is an enlarged, fragmentary, sectional view, with the contact in the same state of compression as in FIG. 3.

DESCRIPTION OF PREFERRED EMBODIMENT

In the drawings, the connector chosen for illustration has been designated 10 and includes a molded rectangular housing 12 of dielectric material, preferably a plastic such as a polyester reinforced with glass fibers. Housing 12 has side walls 14 upstanding from surfaces 16 which, in turn, are elevated from a central floor 18. Adjacent its ends, housing 12 has a pair of pins 20 with notched, flared upper ends adapted to extend through openings in a ceramic substrate 22 and a hold down plate 24. Substrate 22 carries a leadless, integrated circuit (IC) package. Housing 12 also has depending pins 26 (FIGS. 3 and 4) that fit into guide holes in a printed circuit (PC) board 28. The latter is an epoxy coated, copper base with circuitry deposited on the epoxy coating.

To establish an interconnection, housing 12 is located on PC board 28, with pins 26 in the guide holes, and a fastener 30 (FIG. 4) is threaded into a rectangular plate 32 located in an elongated recess in floor 18. Then, substrate 22 or another planar circuit element and hold down plate 24 are forced onto pins 20 and the entire assembly is secured by bolts 34, spacers 36 and nuts 38.

In each surface 16 of housing 12, there is a plurality of openings 40 through which arcuate segments of spring contacts 42 project in alignment with pads on substrate 22. As will be explained more fully hereinafter, each contact 42 also has another arcuate segment that projects through an opening in the bottom surface of housing 12 in alignment with pads on PC board 28.

The contacts 42 are formed, from strips of spring metal stock, e.g., beryllium copper or phosphor bronze, in a progressive die. Blanks are struck, leaving a carrier strip, and then subjected to multiple bending steps. If desired, the contacts can be pre-plated and finished with a gold flash coating. They can be severed from the carrier strip either before or after insertion into cavities 44 in housing 12.

In FIG. 2, a contact 42 has been shown in the relaxed state. Intermediate its ends, contact 42 has been doubly folded into a mounting portion 46 having barbs 48 on the edges of its outer layers. Both layers extend downwardly a short distance from mounting portion 46 and are then bent laterally into opposed, compound, cantilever springs 50, 52 having first legs 54, 56 and second legs 58, 60 interconnected by arcuate bends or bights 62, 64. Legs 54, 56 extend from the mounting portion as beams disposed at an included angle of about 10°. Leg 56 is integral with a carrier strip 57. The included angles between legs 54, 56 and legs 58, 60 are larger but nevertheless acute. Leg 58 is bowed inwardly toward mounting portion 46 and then bent back in an arcuate contact segment 66 having a dimpled protrusion or crown 67 formed in the die. As best shown in FIG. 6, crown 67 is centrally located and extends longitudinally around the bend. Spring 50 has its free end bent laterally into a pre-load tab 68. Leg 60 of spring 56 has an arcuate contact segment 70 provided with a dimpled protrusion 71. Segments 66, 70 and the top of mounting portion 46 can be striped or plated with gold or tin for improvement of the electrical contacts.

The angle included by bend 62 in spring 50 is appreciably larger than the angle included by the bend 64 in spring 52. Leg 58 is inwardly bowed and longer than leg 60. The angles at which beams 54, 56 are bent from mounting protion 46 differ slightly. Since these differences equate to a difference in spring rates, the springs 50, 52 are referred to herein as unbalanced.

In FIGS. 3 and 6, a contact 42 has been shown with its mounting portion 46 frictionally fitted into a pocket 72 offset and divided from the rest of contact-receiving cavity 44 by a projection 74 that joins side wall 14 of housing 12 in a ledge 76. Ledge 76 is engaged by pre-load tab 68 when mounting portion 46 is lodged in pocket 72. With tab 68 on ledge 76, spring 50 is partially compressed and upper contact segment 66 projects through the opening 40 of cavity 44. Similarly, lower contact segment 70 projects through the opening of the cavity in a lower surface 78 of body 12 and slightly beyond standoffs 80. The overall width of mounting portion 46 at barbs 48 is greater than the width of cavity 44 and pocket 72. Between lower surface 78 of housing 12 and pocket 72, each wall of cavity 44 is provided with a shallow recess 81 to clear tabs 82 left when each contact is severed from its carrier strip and barbs 48 until their entry into the pocket. Except for tabs 68 and mounting portion 46, contacts 42 are free and clear of housing 12.

Referring to FIG. 4, the connector 10 is shown with a PC board 28 fastened in place and spring 52 compressed. In the compression of spring 52, contact segment 70 is wiped outwardly on a pad on the PC board.

In FIG. 5, substrate 22 has been moved into position on pins 16 and hold down plate 24 has been attached by fasteners 34, 36, 38 (FIG. 1). As substrate 22 is moved toward surface 16, spring 50 is compressed and upper contact segment 66 is wiped outwardly on a pad on the substrate. During compression of spring 50, tab 68 moves away from ledge 76, leg 58 is bowed further inwardly, bend 62 collapses slightly, beam 54 moves into engagement with beam 56 and spring 52 is compressed additionally. The further compression of spring 52 imparts a second, outward wipe by segment 70. The net effect is an approach toward a balance in the forces exerted by springs 50, 52 and the important second wipe by segment 70. Except for mounting portion 46, contact 42 is not in frictional engagement with housing 12. This freedom facilitates a full utilization of the spring properties in individual contacts and achievement of a predictable level of performance between contacts that is limited only by the precision with which they are manufactured.

With substrate 22 in place on a housing 12, mounting portions 46 of contacts 42 are accessible to a test probe through openings 84. In this manner, integrity of the contacts and coupled circuits can be checked after all interconnections have been established.

Having thus described the invention, what is claimed as new and desired to be secured by Letters Patent is:

1. An electrical connector comprising: a dielectric housing with opposed surfaces adapted to mate with circuit elements having contact pads thereon, said housing having at least one contact-receiving cavity including openings in said surfaces and a pocket offset from the openings; and a contact formed from a strip of conductive spring metal, said contact having a folded mounting portion intermediate its ends and extending in the same direction from said portion in lengths bent into opposed unbalanced compound cantilever springs, said lengths having first legs relatively disposed to one another at acute angles and second legs bent back from and overlying the first legs, said mounting portion being frictionally fitted into said pocket, each second leg including an arcuate segment projecting into one of said openings, said springs and housing being so configured that said first legs are resiliently shiftable into substantial contact with each other in response to pressure exerted on said arcuate segments.

2. The connector of claim 1 wherein the angle between the first and second legs of one spring is greater than the corresponding angle of the other spring.

3. The connector of claim 2 wherein the second leg of said one spring is bowed inwardly toward said mounting portion.

4. The connector of claim 2 wherein is provided a ledge on the housing within the cavity adjacent one of said surfaces and said second leg terminates in a tab in engagement with the ledge when the contact is lodged in the cavity.

5. The connector of claim 2 wherein each arcuate segment has a protrusion extending longitudinally of the strip, said protrusions being adapted to engage conductive pads on the circuit elements.

6. As an article of manufacture, an electrical contact formed from a strip of conductive spring metal, said contact having a fold intermediate its ends and extending from the fold as opposed unbalanced compound cantilever springs, said springs having straight first legs extending in the same direction from said fold, the included angle between said first legs being about 10°, each spring having a second leg joined to its first leg by an arcuate bend, the included angles said first legs located between said second legs, having an arcuate contact segment adjacent its ends.

7. The contact of claim 6 wherein the included angle between the legs of one spring is greater than the corresponding angle of the other spring.

8. The contact of claim 7 wherein the second leg of one spring is bowed inwardly toward said fold.

* * * * *